United States Patent
Yuzawa

[11] Patent Number: 6,040,093
[45] Date of Patent: Mar. 21, 2000

[54] METHOD AND TRANSFERRING CONDUCTOR PATTERNS TO A FILM CARRIER, AND MASKS AND FILM CARRIERS TO BE USED THEREFOR

[75] Inventor: Hideki Yuzawa, Nagano-ken, Japan

[73] Assignee: Seiko Epson Corporation, Tokyo, Japan

[21] Appl. No.: 09/029,357

[22] PCT Filed: Jun. 4, 1997

[86] PCT No.: PCT/JP97/01889

§ 371 Date: Apr. 20, 1998

§ 102(e) Date: Apr. 20, 1998

[87] PCT Pub. No.: WO97/50121

PCT Pub. Date: Dec. 31, 1997

[30] Foreign Application Priority Data

Jun. 25, 1996 [JP] Japan ................................. 8-165001

[51] Int. Cl.[7] .................................................. G03F 9/00
[52] U.S. Cl. ................................. 430/5; 430/22; 430/30
[58] Field of Search .................................... 430/5, 22, 30

[56] References Cited

U.S. PATENT DOCUMENTS 5,733,708  3/1998  Cantanzaro et al. .................. 430/22
5,795,687  8/1998  Yasuda ................................. 430/22
5,856,054  1/1999  Tomimatu ............................ 430/22

FOREIGN PATENT DOCUMENTS 59-88859    5/1984   Japan.
62-234337  10/1987   Japan.
4-181749    6/1992   Japan.
4-116857   10/1992   Japan.
4-299332   10/1992   Japan.
5-323621   12/1993   Japan.

*Primary Examiner*—Christopher G. Young
*Attorney, Agent, or Firm*—Oliff & Berridge, PLC

[57] ABSTRACT

A method of transferring a conductor pattern to a film carrier on which an electronic device is mounted. Using a mask having a pattern and two or more conductor pattern positioning marks, the mask pattern is preliminarily transferred to a film carrier coated with photoresist. Deviations between the position of the transferred positioning marks with respect to reference coordinates of the film carrier and a designed position are measured, the position of the mask with respect to the film carrier is adjusted, and then the mask pattern is fully transferred to the film carrier. Also, a mask for performing the above-described method that has a conductor pattern and two or more conductor pattern positioning marks is disclosed. Furthermore, a film carrier in which a conductor pattern and two or more conductor pattern positioning marks for the film are transferred to the surface of the conductor layer is disclosed.

20 Claims, 4 Drawing Sheets

METHOD AND TRANSFERRING CONDUCTOR PATTERNS TO A FILM CARRIER, AND MASKS AND FILM CARRIERS TO BE USED THEREFOR

BACKGROUND OF THE INVENTION

1. Field of the Invention

The present invention relates to a film carrier that is used for TAB mounting of electronic devices such as semiconductor devices, to a method of transferring conductive patters to correct positions, and to masks to be used therefor.

2. Discussion of the Related Art

When electronic devices, such as, semiconductor devices, are mounted with TAB (Tape Automated bonding), a film carrier is used as a base substrate. One example of a film carrier is shown in FIG. 1.

A film carrier has an insulation film 2 as a base substrate material, a conductor pattern 8 provided on the film, and an aperture 6 provided at a position separated a predetermined distance from each of both edges of the film 2. The aperture 6 shown in FIG. 1 is positioned generally at the center of the tape in its width direction (a direction perpendicular to the transfer direction). The film 2 has index perforation holes (which are also called sprocket holes, and hereinafter referred to as "IP") 4 formed along both of the edges in the transfer direction. The IP 4 is used to control feeding of the film in a variety of transfer processes and used as references for position coordinates on the film, for example, in the manufacture of a film carrier wherein a conductor pattern is formed on the film, in the feeding or positioning steps in ILB (inner lead bonding) process, and the like. A part of the conductive pattern 8 protrudes into the aperture 6 (the protruded section is called an "inner lead"), wherein electronic devices such as semiconductor devices are electrically connected to the inner lead section. In other words, electrode sections of an electronic device are positioned within the aperture 6.

A conductive pattern 8 of a film carrier is typically manufactured by the following steps as shown in FIGS. 2(a)–2(g).

(1) A first step of adhering a conductor layer 5 of a metal film such as a copper film (FIG. 2(b)) on a top surface of a film 2 that defines IP 4 and apertures 6 and that is coated with an adhesive (not shown) (FIG. 2(a)), (2) A second step of coating photoresist 7 on the surface of the conductor layer 5 (FIG. 2(c)), (3) A third step of performing exposure, using a mask 10 having a pattern for forming a conductor pattern, thereby printing the pattern for forming the conductor pattern on the photoresist 7, (4) A fourth step of etching the structure wherein the photoresist 7 exposed in the third step remains on the conductor layer 5 (FIG. 2(e)) to form a predetermined conductor pattern, and then removing the photoresist, and (5) A fifth step of plating the conductor pattern 8 of a film carrier in which the photoresist 7 has been removed (FIG. 2(f)) with tin or the like 12 as required (FIG. 2(g)).

In one embodiment, a protection resist is coated on the rear side of the conductor layer 5, the surface of the conductor layer 5 is etched, and the photoresist 7 and the protection resist are removed.

Referring also to FIG. 3, in the third step in which the photoresist 7 is exposed, using the mask, the following method is often used. A conductor pattern forming pattern 102 representing the shape of the conductor pattern 8 to be exposed is drawn on a glass mask 10. Using this mask, the conductor pattern forming pattern drawn on the mask is exposed on the photoresist 7 of the film carrier, using a lens 13 of, for example, the magnification of 1 to 1 or 1 to 2, developed and fixed, and etching is performed to form the conductor pattern 8.

Connecting sections of the conductor pattern 8, i.e., inner leads, to be connected to an electronic device protrude into the aperture 6, and the inner leads of the conductor pattern 8 are connected to electrodes of an electronic device within the aperture 6. Therefore, considering the position of the electronic device while it is connected and after it has been connected, positioning of the conductor pattern 8 and the aperture 6 is also required. It is noted that the apertures 6 can be formed in the film carrier with high precision by a conventional technique, using the IP reference line as a reference.

The conductor pattern 8 has rod-shaped sections extending from the film into the aperture 6 so that an electronic device is connected thereto. Therefore, if the position of the conductor pattern is deviated from the IP reference coordinates 24 (X axis), 26 (Y axis), when an electronic device is connected to the conductor pattern, the rod-shaped extended conductor sections may be bent, resulting in faulty connection, cutting of the circuit or short-circuit, or the conductor sections may not be connected to an electronic device. Accordingly, the electronic device may break down.

Deviations of the conductor pattern with respect to the IP reference coordinates 24, 26 are defined by three different deviations, namely, X-direction deviation in a direction of the length of the film, Y-direction deviation in a direction perpendicular thereto, and a rotational deviation. If the three deviations can be detected prior to the full transfer forming, the position of the mask on an exposure apparatus (not shown) can be adjusted to dispose the conductor pattern forming pattern at the correct position on the film carrier, namely, at the correct position that is calculated and designed, and then the pattern is exposed.

To detect deviations of the position of the conductor pattern, in other words, deviations of the conductor pattern from its correct position on the film carrier, the following method has been used.

(1) When a film carrier is preliminarily exposed, developed and fixed, a conductor pattern is observed on a conductor layer. By using IP reference coordinates 24, 26 shown in FIG. 1 as references, a relative position of a conductor pattern 8 transferred by the use of a projector is measured. Based on the measured value, deviations of the conductor pattern from the designed position are detected, so that the position of the mask on the exposure apparatus is adjusted.

However, according to this method, the designed position of the conductor pattern and the preliminarily formed position are superposed and projected. Since deviations at different areas of the conductor pattern are different from one another, it is difficult to obtain the above-described three types of deviations in one lot. As a result, the number of required positional corrections increases.

(2) Japanese Laid-open patent application SHO 59-88859 describes a method in which a metal foil film carrier is used as a film carrier, wherein both of an IP pattern and a conductor pattern forming pattern are drawn on a mask, these patterns are transferred on the metal foil and then the IPs are perforated. This method is not applicable when a film carrier has IPs formed in advance.

(3) Japanese Laid-open patent application SHO 62-234337 describes a method in which "+" marks for positioning are drawn on a mask, the marks are transferred to a film carrier, and an electric device is positioned based on the marks. In accordance with this method, even if the conductor pattern is deviated from the IP reference coordinates, the electric device can be correctly disposed with respect to the conductor pattern. However, this method cannot be used for correcting deviations of the conductor pattern from the IP reference coordinates. Also, a line used in the "+" mark has a certain thickness, resulting in the lowered positioning accuracy.

SUMMARY OF THE INVENTION

An object of the present invention is to provide a method of correctly transferring a conductor pattern to a designed position with respect to IP reference coordinates on a film carrier.

The present invention relates to a method basically including the following steps of transferring a conductor pattern to a film carrier on which an electronic device is mounted:

(a) a step, with a film carrier having a film defining an electronic device mounting aperture and a conductor layer covering the film, of coating photoresist on the conductor layer, (b) a step of preliminarily transferring a mask pattern to the film carrier by a mask having a conductor pattern and two or more conductor pattern positioning marks, (c) a step of measuring deviations between positions of the transferred positioning marks with respect to reference coordinates of the film carrier and designed positions, (d) a step of adjusting the position of the mask with respect to the film carrier based on the deviations, and (e) a step of transferring the mask pattern onto the photoresist on the film carrier after adjusting the position of the mask with respect to the film carrier.

In one embodiment, two of the transferred two or more positioning marks are selected, deviations in X-axis and Y-axis between the position of the marks with respect to the reference coordinates on the film carrier and the designed position are measured, further, a straight line is drawn between the two marks, and deviations between an angle with respect to the reference coordinates and a designed angle are measured, so that the position of the mask can be adjusted with respect to the film carrier.

The positioning marks are preferably provided in an area of the aperture for an electronic device. Since the aperture section is removed when the film carrier is completed, the marks can be eliminated by etching. In this case, they are required to be set at width and thickness that can be eliminated by etching.

Also, the present invention includes a mask to be used to perform the above-described method for transferring a conductive pattern to a film carrier, the mask having a conductive pattern and two or more conductive pattern positioning marks for the film.

Furthermore, in the above-described film carrier, the present invention includes a film carrier wherein a conductor pattern and also two or more conductor pattern positioning marks for the film are transferred to a photoresist layer coated on the metal foil surface.

In accordance with the present invention, in BTAB in which an electronic device is mounted on the under side of a film carrier, for etching both sides of the film carrier, positioning marks in accordance with the present invention are provided in masks that are disposed on the upper surface and the lower surface of the film carrier, so that the positioning of the film and the two masks can be performed with high precision.

Any one of shapes that are point-symmetrical about their centers can be used as the marks.

Similar reference characters denote corresponding features consistently throughout the following drawings, in which:

DETAILED DESCRIPTION OF PREFERRED EMBODIMENTS

The present invention basically includes the following steps:

(a) a step, with a film carrier having a film defining an electronic device mounting aperture and a conductor layer covering the film, of coating photoresist on the conductor layer, (b) a step of using a mask having a conductor pattern and two or more conductor pattern positioning marks, and preliminarily transferring the mask pattern to the film carrier, (c) a step of measuring deviations between position of the transferred positioning marks with respect to reference coordinates of the film carrier and designed position, (d) a step of adjusting position of the mask with respect to the film carrier based on the deviations, and (e) a step of fully transferring the mask pattern onto the photoresist on the film carrier after adjusting the position of the mask with respect to the film carrier.

A film carrier in accordance with the present invention includes a film having the width of about 35 160 mm and IPs provided adjacent both edges in the width direction thereof. This film may be covered by a conductor layer, such as a metal foil having the thickness of 15 100 $\mu$m through adhesive, defining a three layered film carrier, or this film may be plated with a metal foil, defining a two layered film carrier. The metal foil is typically a copper foil. A base material of the film of the film carrier is typically a tape formed from an insulative polyimide resin, which is similar to a photographic film. From the viewpoint of flexibility, the tape base material may be polyester material. Glass epoxy material or BT resin material may also be used although they are somewhat inferior from the viewpoint of flexibility.

Figure 1:
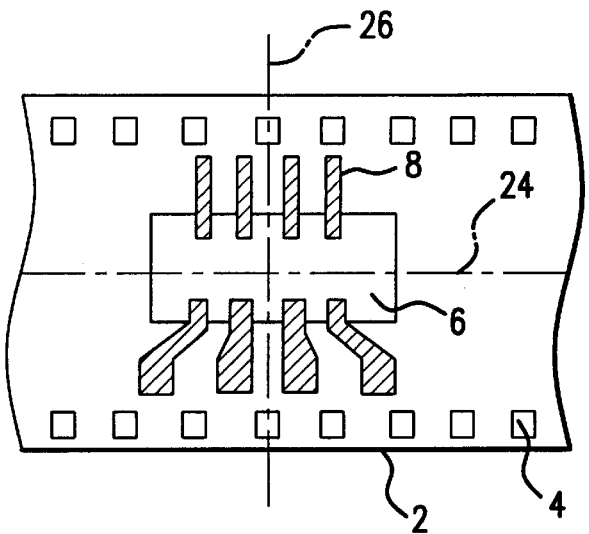
FIG. 1 shows the typical configuration of a film carrier on which a conductor pattern is transferred.
Figure 2A:
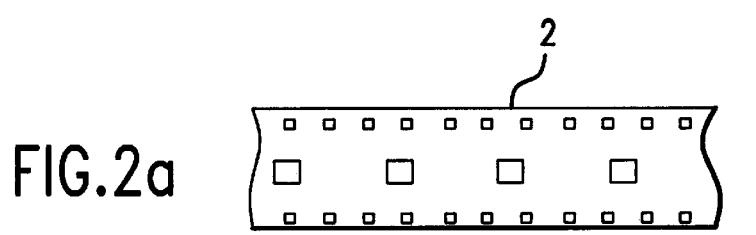
FIGS. 2(a)–2(g) show steps of manufacturing a film carrier.
Figure 2B:
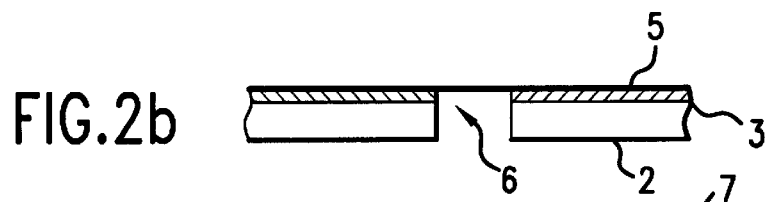
Figure 2C:
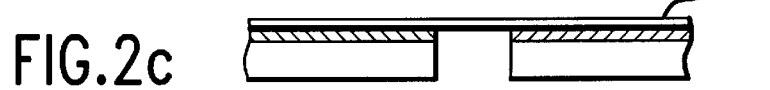
Figure 2D:
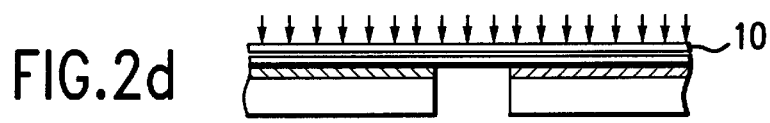
Figure 2E:
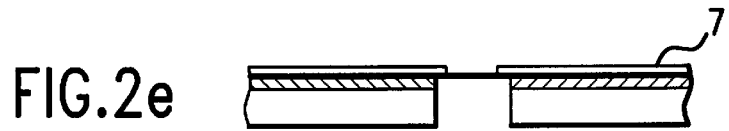
Figure 2F:
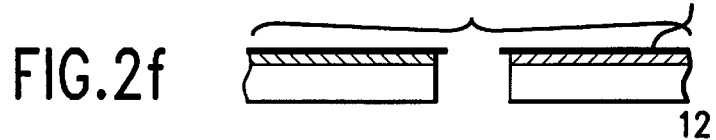
Figure 2G:
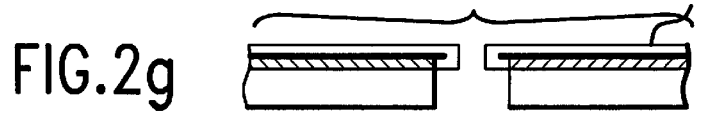
Figure 3A:
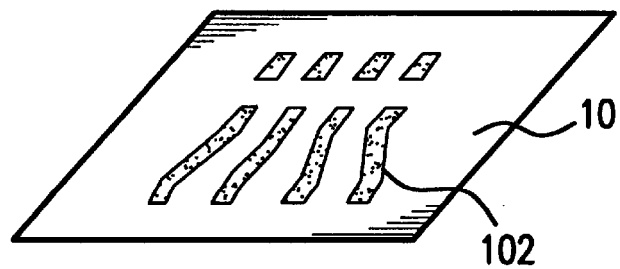
FIG. 3 is used to explain a method of transferring a conductor pattern on a mask to a film carrier by an exposure apparatus which is not shown.
Figure 3B:
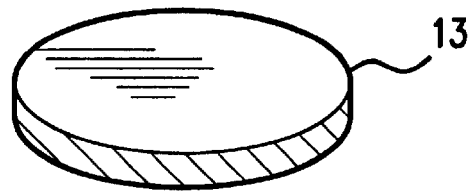
Figure 3C:
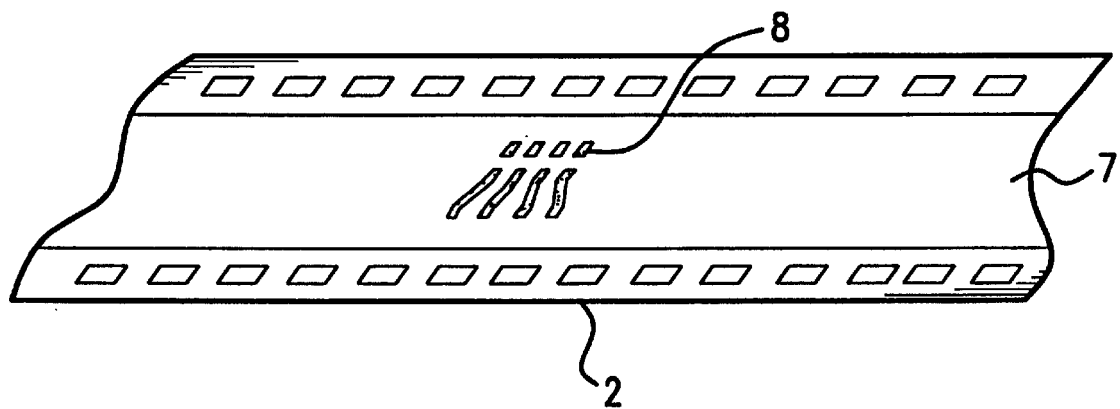
Figure 4A:
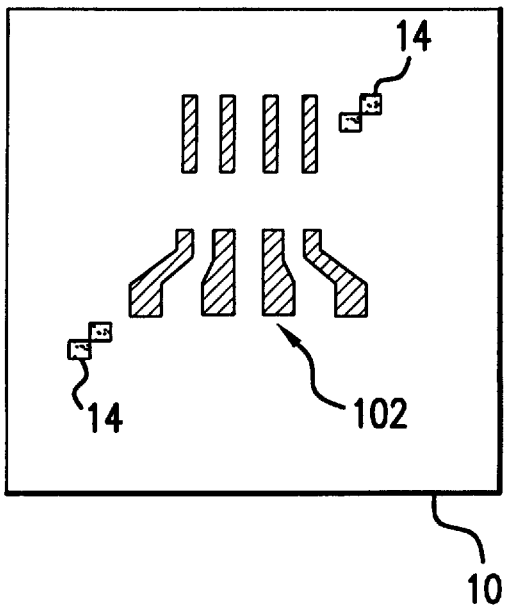
FIGS. 4(a) and 4(b) are masks, each having a conductor pattern.
Figure 4B:
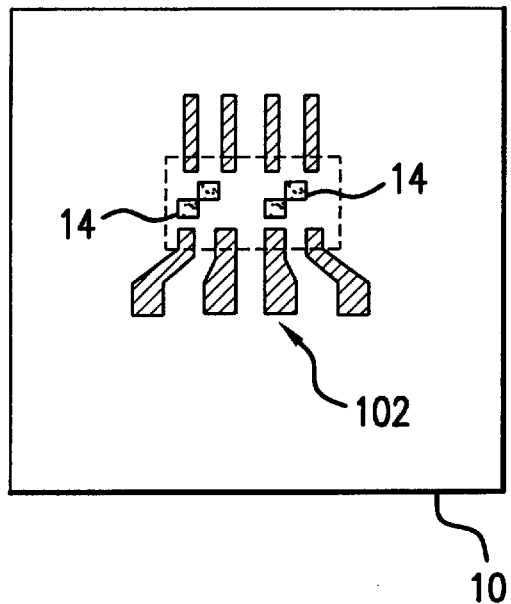

Embodiments of the present invention will be described with reference to FIGS. 2(a)–2(g), 4(a), 4(b) and 5(a)–5(e). FIGS. 4(a) and 4(b) show plan views of exemplary marks 10 used in an exposure process performed to form a conductor layer 5 into a conductor pattern 8 shown in FIGS. 2(a)–2(g). The mask 10 is provided with patterns, i.e., a conductor pattern forming pattern 102 for securing connection with an electronic device and two positioning marks 14. Because the positioning marks 14 are provided, exposure light, such as ultraviolet light, for the exposure process is blocked at locations corresponding to the marks 14. Accordingly, after developing and fixing processes are performed, shapes identical with the conductor pattern forming pattern 102 and positioning marks 14 are formed on the conductor layer 5.

Then, positions of the two positioning marks 14 transferred onto the conductor surface are measured based on IP reference coordinates 24 (X-axis) and coordinates 26 (Y-axis) as references. For the measurement, a tool microscope or a projector is used. By judging the positions of the two positioning marks 14 based on the IP reference coordinates 24, 26, deviations of the mask mounted on an unshown exposure apparatus can be detected.

The process will be described in detail below.

(1) Let us consider a case in which designed locations for the two positioning marks with respect to the IP reference coordinates are (P1, Q1) and (P2, Q2), respectively. Angles defined between a straight line extending through the two positioning marks and the IP reference coordinates are calculated by arctan ((Y2−Y2)/(X2−X1)).

(2) Positions of the two positioning marks with respect to the IP reference coordinates are obtained. Let us assume that positions (X1, Y1), (X2, Y2) are measured.

(3) A deviation of the formed conductor pattern in the X-direction and a deviation thereof in the Y-direction are calculated by (X1−P1) and (Y1−Q1), respectively. When these values are zero (0), there are no deviations in the corresponding X-direction and Y-direction.

(4) A rotational deviation of the formed conductor pattern is calculated by arctan((Q2−Q1)/(P2−P1))-arctan((Y2−Y1)/(X2−X1). When this value is zero (0), there is no rotational deviation.

(5) The position of the mask on the unshown exposure apparatus is corrected based on the deviations in the X-direction, the deviation in the Y-direction and the rotational deviation obtained by the measurement and the calculation.

After the correction, the film carrier is fed by the unshown exposure apparatus and is repeatedly exposed so that many conductor patterns are transferred onto the long film carrier. By this method, the conductor patterns 8 are formed on the film with high positional accuracy. The positional accuracy is about ±50 μm according to the conventional method. However, it is less than ±20 μm according to the method of the present invention, and no correction is required in almost all cases. Even if any correction is required, one or two corrections may be enough.

Next, positions and shapes of the positioning marks will be described.

The positioning marks 14 may be disposed, for example, about the peripheral area of the conductor pattern of the film carrier. When the positioning marks 14 are not desired to remain, they are disposed within an area of the aperture in which electronic device is disposed. In this case, the positioning marks 14 are eliminated when the conductor layer 5 at the aperture is etched. Therefore, a film carrier having a conductor pattern 8 being transferred at high positional precision is obtained without modifying the conductor pattern 8. Moreover, areas about the positioning marks 14 of the remaining film can be used, for example, for wiring, thus improving the freedom of design. The size of a positioning mark can be as small as the one that can be observed by a microscope, for example, about 10 100 μm. Its shape may be the one whose central position can be clearly recognized, preferably, a point-symmetrical shape whose central position is recognizable.

Figure 5A:
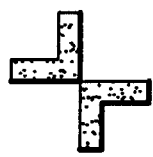
FIGS. 5(a)–5(e) are examples of a variety of positioning marks.
Figure 5B:
Figure 5C:
Figure 5D:
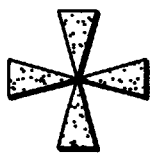
Figure 5E:
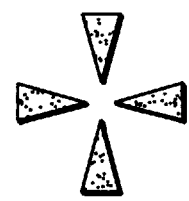

FIGS. 5(a) through 5(e) show examples of positioning marks. Among these figures, FIG. 5(a) shows a positioning mark having a shape in which angled corners of L-shaped images are opposed to each other. In particular, the position of the central point thereof is detected with high precision. Further, since the width of the conductor section defining this shape can be made narrow, it will be perfectly eliminated in a step of etching the conductor layer 5. The marks shown in FIGS. 5(b) through 5(e) generally have the same function.

Next, a method of positioning in which a film carrier and an electronic device are connected by BTAB will be described.

Figure 6:
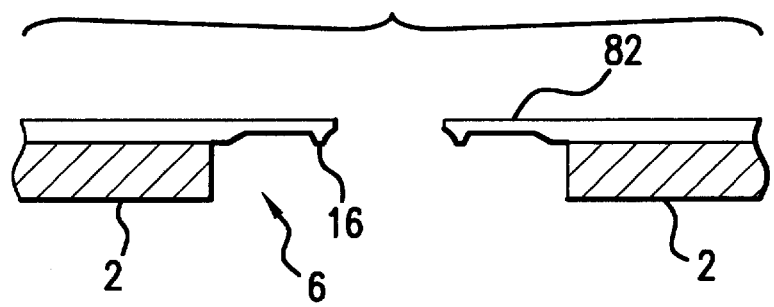
FIG. 6 shows a manufacturing step in BTAB (Bumped Tape Automated Bonding).

FIG. 6 shows the shape of leads in accordance with one embodiment of BTAB connection. In ordinary TAB, bumps are provided on the side of an electronic device, and the electronic device is mounted on the lower side of the leads (on the device hole side as viewed from the leads) to thereby connect the bumps and the leads. On the other hand, in BTAB, bumps 16 are integrally formed on the leads, and are directly connected to pads of an electronic device. In the case of BTAB, for example, an electronic device is brought, from beneath, into contact with the bumps 16 that are provided at the tip portions of the leads or the conductor pattern shown in the same figure (namely, rear BTAB). Alternatively, bumps are formed on the upper side thereof (unshown), and an electronic device is brought, from above, into contact with the bumps (namely, front BTAB). In accordance with the present embodiment, rear BTAB will be described with reference to FIG. 6. In BTAB, both of the conductor layer side of the film carrier (hereafter referred to as "upper surface") and the film side of the film carrier (hereafter referred to as "lower side") are exposed, developed and fixed, and then etched. Portions of the thickness of the conductor pattern are etched from the upper surface and the lower surface of the conductor pattern to form bumps. The bumps secure the connection with an electronic device.

It is noted that, for forming such a conductor pattern, exposure, development, fixing and etching are required from both of the upper surface and the lower surface. Therefore, a mask to be used for exposure of the upper surface and a mask pattern to be used for exposure of the lower surface have to be precisely positioned based on the IP.

In accordance with the present invention, positioning marks are drawn on both of the masks for the upper surface and the lower surface, and the positioning method described above is applied to each of the masks. Accordingly, precise positioning can be performed.

Furthermore, positioning marks are drawn so that a coordinate position at which a positioning mark drawn on a mask for the upper surface is exposed is set at the same location of a coordinate position at which a positioning mark drawn on a mask for the lower surface is exposed. Further, the marks are designed to have shapes that are mated with each other. As a result, by simultaneously observing the upper surface and the lower surface of the film carrier by a double-sided microscope, deviations in X-direction and Y-direction and rotational deviation between the upper conductor pattern and the lower conductor pattern are detected.

For example, when the upper mask is sufficiently accurately positioned with respect to the IP reference coordinates, the lower mask may be positioned with respect to the upper conductor pattern, instead of the IP reference coordinates. This could result in positioning of bumps with higher accuracy. In accordance with the present invention, a double-sided microscope is used, as described above. Accordingly, the lower surface can be positioned based on the upper surface as a reference.

Figure 7A:
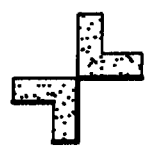
FIGS. 7(a)–7(e) show examples of a variety of positioning marks that are suitable for manufacturing steps in BTAB.
Figure 7B:
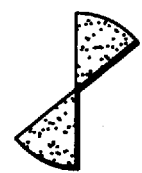
Figure 7C:
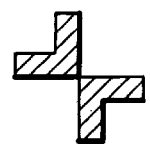
Figure 7D:
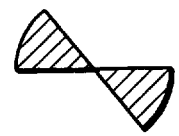
Figure 7E:
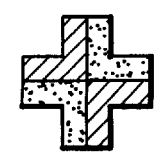
Figure 7F:
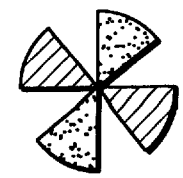

Preferred embodiments of positioning marks having shapes that mate with each other are, for example, shown in FIGS. 7(a)–7(g). The marks shown in FIGS. 7(a) and (b) may be used for the upper surface, and the marks shown in FIGS. 7(c) and (d) may be used for the lower surface. As a result, the marks on both of the surfaces observed by a double-sided microscope are mated with each other as shown in FIGS. 7(e) and (f), respectively.

INDUSTRIAL UTILITY

As described above, in accordance with the present invention, position confirmation marks are provided on a mask that is used in an exposure process in which a conductor pattern is transferred to a film. As a result, three types of deviations, i.e., deviation in X-direction, deviation in Y-direction and rotational deviation, in the position of a conductor pattern that is transferred from the mask to the film carrier are readily detected. Therefore, correction of the position of the mask is easy, the time required for the correction is drastically shortened, and a film carrier is manufactured with high conductor pattern positional accuracy. A method of the present invention is also applicable to forming conductor patterns for BTAB connection. Also, marks according to the present invention are used for correctly setting a mask with an exposure apparatus. However, the marks can also be used for correctly setting an electronic device to conductor patterns in a post process.

We claim:

1. A method of transferring a conductor pattern to a film carrier having index perforation holes defining film carrier reference coordinates, comprising:
    coating photoresist on a conductor layer of a film carrier having a film with an aperture;
    projecting and preliminarily transferring a mask pattern, including a conductor pattern forming pattern and two or more positioning marks, to the photoresist of the film carrier;
    measuring deviations between a position of the transferred positioning marks with respect to said reference coordinates of the film carrier and a designed position;
    adjusting positioning of the mask with respect to the film carrier based on the deviations; and
    transferring the mask pattern to the film carrier after adjusting positioning of the mask with respect to the film carrier.

2. A method according to claim 1, further comprising:
    measuring deviations in the directions of an X-axis and a Y-axis between a position of said at least one of the transferred two or more positioning marks with respect to said reference coordinates of the film carrier and the designed position;
    constructing an imaginary straight line between said at least one of the transferred two or more positioning marks and another one of said at least one of the transferred two or more positioning marks selected;
    measuring a deviation of an angle of said imaginary straight line with respect to the reference coordinates and a designed angle; and
    correcting the deviations in the directions of the X-axis and Y-axis and the angle of the mask with respect to the film carrier.

3. A method according to claim 1, wherein each positioning mark is symmetrical about the central point thereof.

4. A method according to claim 1, wherein the positioning marks are transferred to an area defining the aperture, and after adjusting the position of the mask with respect to the film carrier, the marks are eliminated by etching.

5. A mask for transferring a conductor pattern to a film carrier having index perforation holes defining reference coordinates, said film carrier mounting an electronic device, the mask comprising:
    a conductor pattern forming pattern for forming the conductor pattern, and two or more positioning marks for adjusting position of the conductor pattern with respect to the reference coordinates of the film carrier.

6. A mask according to claim 5, wherein all of the positioning marks are provided within an area defining to a device hole.

7. A film carrier having a film defining aperture for mounting an electronic device and a conductor layer covering the film, comprising:
    index perforation holes defining film carrier reference coordinates; and
    a conductor pattern and two or more positioning marks for adjusting position of the conductor pattern with respect to the film carrier reference coordinates, said conductor pattern and said two or more positioning marks being transferred to a surface of the conductor layer.

8. A method of transferring a conductor pattern for BTAB to a film carrier for mounting an electronic device comprising:
    coating photoresist on one surface of the film carrier, another surface of the film carrier having a film defining an aperture and a conductor layer covering the film;
    transferring, preliminarily, a pattern of a first mask for the one surface, the pattern including a conductor pattern forming pattern and two or more positioning marks, and a pattern of a second mask for the other surface, the pattern of the second mask including a conductor pattern forming pattern and positioning marks that are in mating relation with the positioning marks transferred from the first mask;
    measuring deviations between a position of the transferred positioning marks for the one surface with respect to the reference coordinates of the film carrier and a designed position;
    measuring deviations between a position of the transferred positioning marks for the other surface with respect to the deviations measured for the one surface;
    adjusting a position of the first mask and the second mask with respect to the film carrier based on the deviations; and
    transferring the first and second mask patterns to the one surface and the other surface of the film carrier, respectively.

9. A method for aligning a pattern relative to a film carrier, including a film with a conductor layer thereon, comprising:
    coating photoresist on the conductor layer;
    aligning a first pattern relative to the film carrier according to a first design position;
    transferring the first pattern onto the photoresist, defining a first transfer pattern;
    measuring a first deviation between the first transfer pattern and the first design position;
    aligning the first pattern relative to index perforation holes on the film carrier according to the first deviation; and
    transferring the first pattern onto the photoresist.

10. The method of claim 9, further comprising:
    aligning a second pattern relative to the film carrier according to a second design position;
    transferring the second pattern onto the photoresist, defining a second transfer pattern;

measuring a second deviation between the second transfer pattern and the second design position;

aligning the second pattern relative to the film carrier according to the second deviation; and transferring the second pattern onto the photoresist.

11. The method of claim 10, further comprising:

measuring a third deviation between the first transfer pattern and the second transfer pattern;

aligning the first pattern and second pattern relative to the film carrier according to the third deviation.

12. The method of claim 11, wherein said third deviation is measured in at least one of longitudinal, latitudinal and rotational directions.

13. The method of claim 10, wherein said second deviation is measured in at least one of longitudinal, latitudinal and rotational directions.

14. The method of claim 9, wherein said first deviation is measured in at least one of longitudinal, latitudinal and rotational directions.

15. The method of claim 9, wherein said first pattern comprises a first position mark.

16. The method of claim 15, wherein said first position mark is symmetrical.

17. The method of claim 15, wherein said first position mark is transferred within an area of the film carrier to be removed.

18. The method of claim 10, wherein said first pattern comprises a first position mark and said second pattern comprises a second position mark.

19. The method of claim 17, wherein said first position mark and second position mark define a mated pattern when aligned.

20. The method of claim 8, said measuring deviations between a position of the transferred positioning marks for the one surface occurring prior to said measuring deviations between a position of the transferred positioning marks for the other surface.

* * * * *